(12) United States Patent
Hikita et al.

(10) Patent No.: US 6,534,847 B2
(45) Date of Patent: *Mar. 18, 2003

(54) SEMICONDUCTOR DEVICE

(75) Inventors: Junichi Hikita, Kyoto (JP); Hiroo Mochida, Kyoto (JP)

(73) Assignee: Rohm Co., Ltd., Kyoto (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 38 days.

(21) Appl. No.: 09/496,963

(22) Filed: Feb. 3, 2000

(65) Prior Publication Data
US 2002/0020904 A1 Feb. 21, 2002

(30) Foreign Application Priority Data
Feb. 5, 1999 (JP) .............................. 11-028438

(51) Int. Cl.⁷ .............................................. H01L 23/48
(52) U.S. Cl. .................. 257/678; 257/659; 257/660; 257/690; 257/691; 257/685; 257/686; 257/723; 257/738; 257/778; 257/784
(58) Field of Search ................................ 257/678, 723, 257/777, 659, 660, 690, 691, 685, 686, 784, 738, 778

(56) References Cited

U.S. PATENT DOCUMENTS

| | | | | | |
|---|---|---|---|---|---|
| 4,697,095 | A | * | 9/1987 | Fujii | 307/243 |
| 4,703,483 | A | * | 10/1987 | Enomoto et al. | 371/24 |
| 5,097,205 | A | * | 3/1992 | Toyoda | 324/158 |
| 5,977,640 | A | * | 11/1999 | Bertin et al. | 257/777 |
| 2002/0008309 | A1 | * | 1/2002 | Akiyama | 257/686 |

FOREIGN PATENT DOCUMENTS

| | | | |
|---|---|---|---|
| EP | 486 829 A2 | * | 5/1992 |
| JP | 61-73359 | * | 4/1986 |
| JP | 61-80846 | * | 4/1986 |
| JP | 1-307243 | * | 12/1989 |
| JP | 5-114693 | * | 5/1993 |

* cited by examiner

*Primary Examiner*—Nathan J. Flynn
*Assistant Examiner*—Ahmed N. Sefer
(74) *Attorney, Agent, or Firm*—Arent Fox Kintner Plotkin & Kahn, PLLC

(57) ABSTRACT

A semiconductor device is built by combining together a plurality of semiconductor chips, but nevertheless allows easy functional checking of the individual semiconductor chips before they are assembled together without provision of extra pads for such checking.

5 Claims, 4 Drawing Sheets

SEMICONDUCTOR DEVICE

BACKGROUND OF THE INVENTION

1. Field of the Invention

The present invention relates to a semiconductor device (semiconductor chip) that achieves a desired function when connected to a semiconductor device (semiconductor chip) having a predetermined function so as to be functionally complemented or enhanced thereby, and the present invention relates also to a semiconductor device that is built by connecting together a plurality of semiconductor devices (semiconductor chips) having such a relationship with one another.

2. Description of the Prior Art

Some semiconductor devices achieve desired functions by the use of a plurality of semiconductor chips. A typical example is semiconductor devices that are built by superposing a plurality of semiconductor chips on one another and bonding them together and that thus have chip-on-chip structures.

In this type of semiconductor device, the internal circuit 111 of the mother chip 110 is often designed as an incomplete or insufficient circuit that does not achieve any practical function on its own; that is, this internal circuit 111 is often designed to achieve a desired practical function only when it is functionally complemented or enhanced by the internal circuit 121 of the daughter chip 120. Specifically, for example, the output signal of the internal circuit 111 of the mother chip 110 is fed via the bump 130 to the internal circuit 121 of the daughter chip 2, then the output signal of this internal circuit 121 is fed via the bump 131 back to the mother chip 110, and only then this signal is fed to the external connection pad 121 as a practically significant signal.

The manufacturing process of a semiconductor device imperatively includes steps for functional checking of the semiconductor device, which involve pressing a test probe onto the pads provided on the surface of the semiconductor device. A semiconductor device composed of a plurality of semiconductor chips, if found defective after assembly, cannot be saved from being discarded totally, and therefore it is desirable to conduct functional checking of the individual semiconductor chips constituting such a semiconductor device before assembly.

However, as shown in FIG. 4, in a semiconductor device having a chip-on-chip structure that is built by bonding together a mother chip 110 and a daughter chip 120 with bumps 130 and 131 between them in such a way that the surface of the mother chip 110 faces the surface of the daughter chip 120, the internal circuit 111 of the mother chip 110 is connected to the internal circuit 121 of the daughter chip 120 by way of those bumps 130 and 131. External connection pads 112 for allowing input/output of signals from/to an external device are usually provided near the edge of the surface of the mother chip 110 so as to avoid the region thereon in which the daughter chip 120 is bonded to the mother chip 110.

In this case, the internal circuit 111 of the mother chip 110 is designed as an incomplete or insufficient circuit, and is thus so designed that its output signal is fed only to the bump 130 for connection to the daughter chip 120, and not to the external connection pad 112 on which the test probe is pressed. For this reason, the internal circuit 111 of the mother chip 110 cannot be subjected to functional checking by an ordinary method.

It is of course possible to conduct functional checking by pressing the test probe to the bump 130. However, in general, such a bump 130 is provided in an inner region on the chip surface, and therefore it is not easy to press the test probe thereon accurately.

It is also possible to conduct functional checking by feeding the signal fed to the bump 130 further to another pad so that the signal can be monitored at that pad. However, this inevitably requires extra pads, and, where there are many signal lines to be monitored, requires even a larger chip size. Thus, this method is difficult to practice.

SUMMARY OF THE INVENTION

An object of the present invention is to provide a semiconductor device that is functionally complemented or enhanced by another semiconductor device and that nevertheless allows easy functional checking of itself without provision of extra pads.

Another object of the present invention is to provide a semiconductor device that is built by combining together a plurality of semiconductor chips and that nevertheless allows easy functional checking of the individual semiconductor chips before they are assembled together.

To achieve the above objects, according to one aspect of the present invention, a semiconductor device is provided with a semiconductor substrate, a circuit formed on the semiconductor substrate so as to achieve a desired function by being connected to and thereby functionally complemented or enhanced by another semiconductor device having a predetermined function, a device-to-device connection portion formed on the semiconductor substrate so as to connect the circuit to the other semiconductor device having the predetermined function, an external connection portion formed on the semiconductor substrate so as to allow input/output of a signal from/to a device other than the other semiconductor device, and a switcher formed on the semiconductor substrate so as to switch between a state in which the circuit is disconnected from the external connection portion and a state in which the circuit is connected to the external connection portion.

In this configuration, even though the internal circuit of the semiconductor device is designed as an incomplete or insufficient circuit that achieves a practical function only when functionally complemented or enhanced by the other semiconductor device, and is thus of a kind that is not usually connected directly to the external connection portion, the switcher permits the internal circuit to be connected to the external connection portion. This makes it possible to conduct functional checking of the internal circuit itself independently of the other semiconductor device having the predetermined function, and in addition by the use of the external connection portion, which facilitates such functional checking.

According to another aspect of the present invention, a semiconductor device is provided with a first semiconductor chip having a first circuit, a second semiconductor chip having a second circuit that functionally complements or enhances the function of the first circuit, a device-to-device connection portion for connecting the first and second circuits to each other, an external connection portion formed on the first semiconductor chip so as to allow input/output of a signal from/to a device other than the second semiconductor chip, and a switching circuit formed on the first semiconductor chip so as to switch between a state in which the first circuit is disconnected from the external connection portion and a state in which the first circuit is connected to the external connection portion.

In this configuration, even though the first internal circuit formed on the first semiconductor chip is designed as a practically incomplete or insufficient circuit that needs to be functionally complemented or enhanced by the second internal circuit formed on the second semiconductor chip, and is thus of a kind that is not usually connected directly to the external connection portion, the switching circuit permits the first internal circuit to be connected to the external connection portion. This makes it possible to conduct functional checking of the first semiconductor chip independently without connecting it to the second semiconductor chip.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Hereinafter, embodiments of the present invention will be described with reference to the accompanying drawings.

First Embodiment

Figure 1:
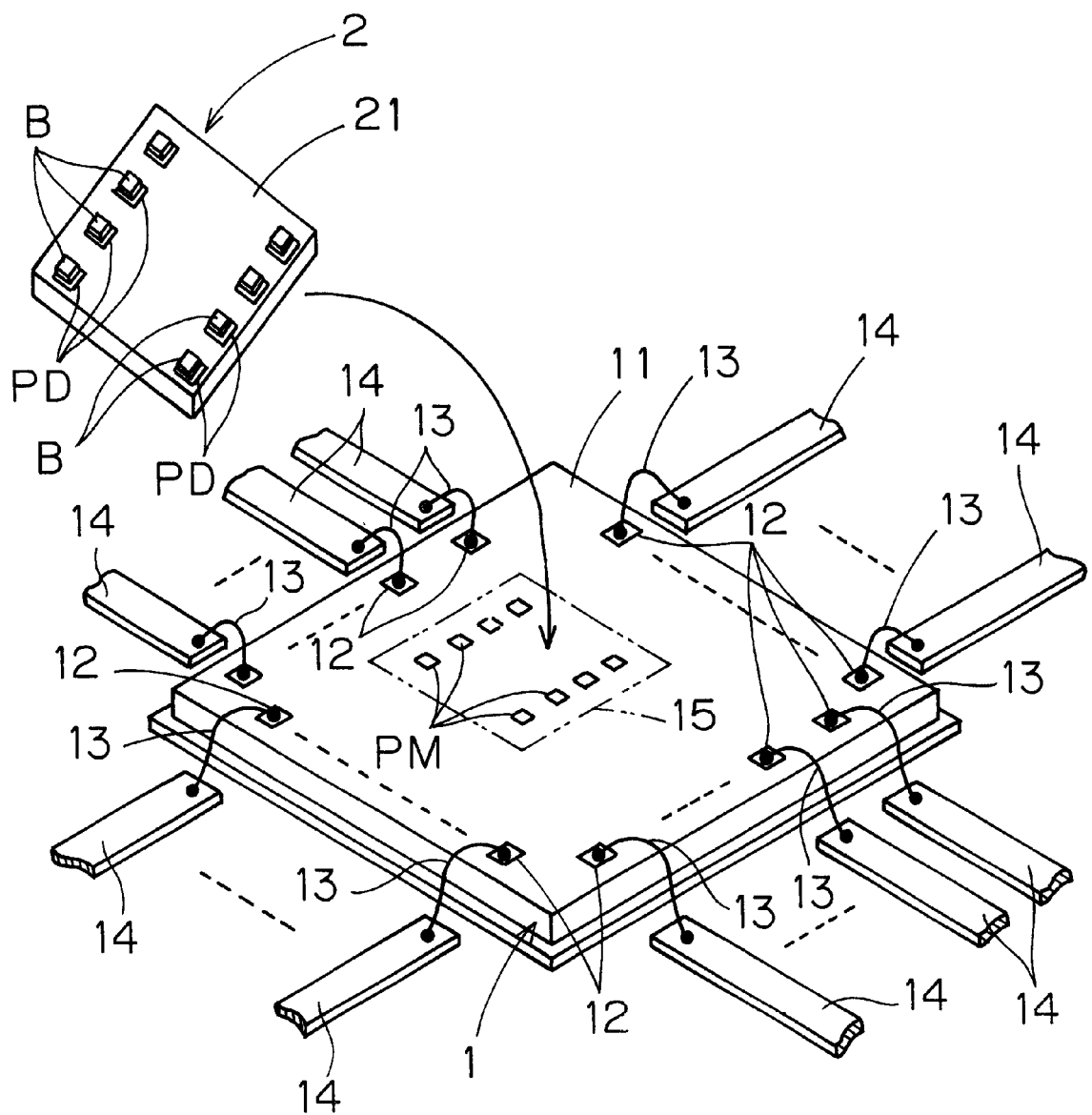
FIG. 1 is an exploded perspective view of the semiconductor device of a first embodiment of the invention.

First, the semiconductor device of a first embodiment of the invention will be described with reference to FIGS. 1 and 2. FIG. 1 is an exploded perspective view of the semiconductor device of the first embodiment of the invention. This semiconductor device has, as a first semiconductor chip, a mother chip 1, and has, as a second semiconductor chip, a daughter chip 2 superposed on and bonded to the surface 11 of the mother chip 1. Thus, this semiconductor device has a socalled chip-on-chip structure.

The mother chip 1 is formed out of, for example, a silicon chip. Its surface 11, i.e. that side of the semiconductor substrate constituting the base of the mother chip 1 on which an active surface-layer region lies in which functional devices such as transistors are formed, is covered with an insulating protective film as the topmost layer. Above this protective film, a plurality of pads 12 (external connection portions) for external connection are arranged so as to be exposed in predetermined positions near the edge of the substantially rectangular and flat surface 11 of the mother chip 1. These external connection pads 12 are to be connected to lead frames 14 by way of bonding wires 13.

In an inner region on the mother chip 1, a bonding region 15 is provided so as to allow the daughter chip 2 to be bonded thereto. In this bonding region 15, a plurality of chip-to-chip connection pads PM (device-to-device, or chip-to-chip, connection portions) are arranged for achieving connection with the daughter chip 2.

The daughter chip 2 is formed out of, for example, a silicon chip. The surface 21 of the semiconductor substrate constituting the base of this daughter chip 2, i.e. that side thereof on which an active surface-layer region lies in which functional devices such as transistors are formed, is covered with an insulating protective film as the topmost layer. Above this protective film, a plurality of pads PD (device-to-device connection portions) are formed so as to be exposed in positions corresponding to the chip-to-chip connection pads PM formed on the mother chip 1. On these pads PD individually, bumps B are formed that are made of an oxidation-resistant metal such as gold, lead, platinum, silver, or iridium.

The daughter chip 2 is bonded to the mother chip 1 with the surface 21 of the former facing the surface 11 of the latter. This bonding is achieved by pressing the mother and daughter chips 1 and 2 onto each other until they are bonded together with the bumps B individually kept in contact with the chip-to-chip connection pads PM formed in the bonding region 15. During this bonding, supersonic vibration is applied, as required, to the mother chip 1 and/or the daughter chip 2 to achieve secure bonding between the bumps B and the chip-to-chip connection pads PM.

Figure 2:
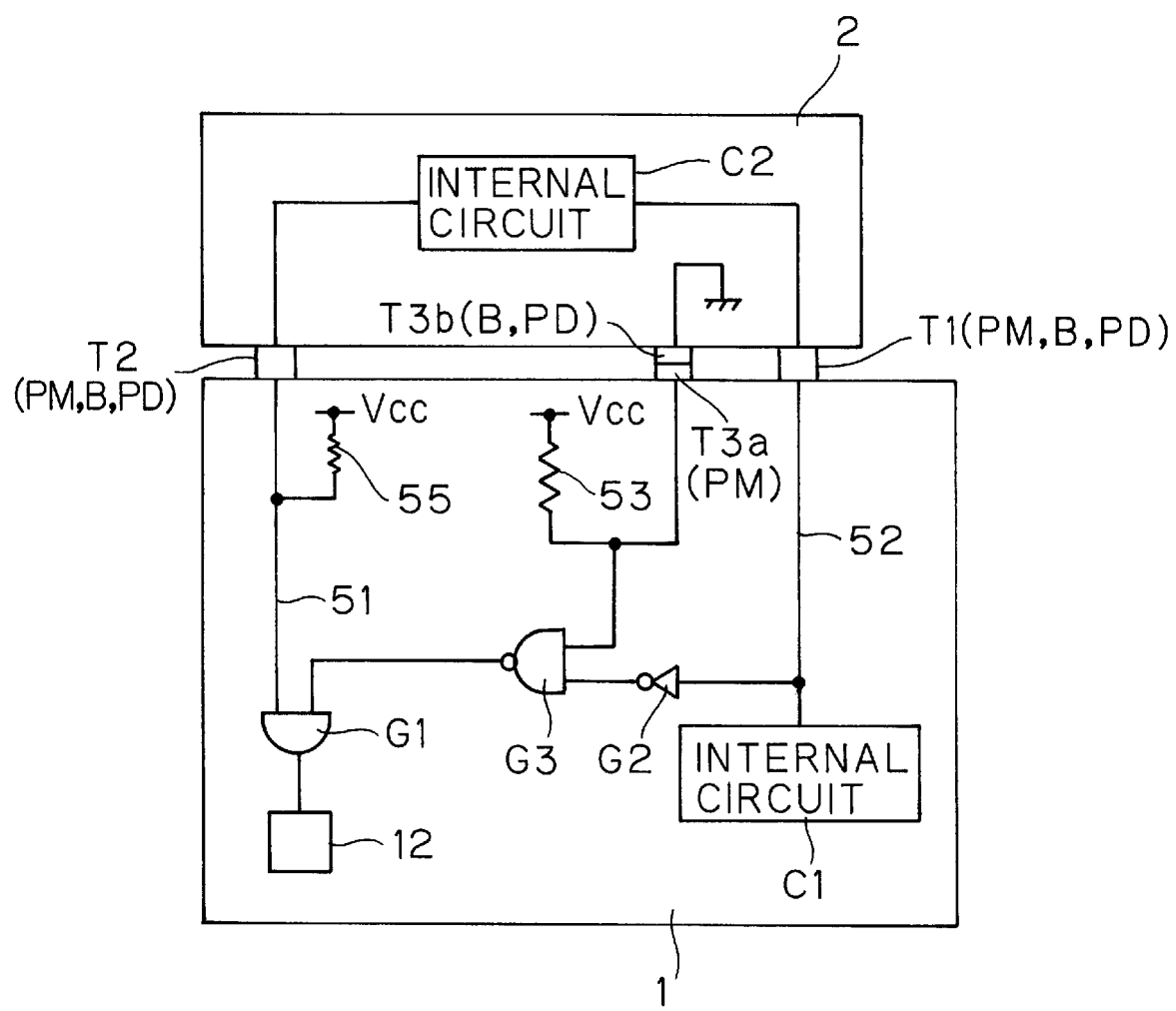
FIG. 2 is a block diagram showing the electrical configuration of the semiconductor device shown in FIG. 1.

FIG. 2 is a block diagram showing the electrical configuration of the semiconductor device described above. The mother chip 1 has a first internal circuit C1, constituting a logic circuit, formed on its semiconductor substrate, and the daughter chip 2 has a second internal circuit C2, also constituting a logic circuit, formed on its semiconductor substrate. The first internal circuit C1 achieves a practical function only when connected to and thereby functionally complemented or enhanced by the second internal circuit C2; that is, the first internal circuit C1 is an incomplete or insufficient circuit that cannot achieve any practical function on its own.

For example, suppose that the first internal circuit C1 is a general-purpose microcomputer and the second internal circuit C2 is a data encryption circuit, the two circuits together constituting a data encryption device. In this case, by interchanging the second internal circuit C2 (i.e. by replacing one type of the daughter chip 2 with another type), the encryption method can easily be changed for higher security. Thus, this is a typical example where the configuration described above can suitably be used.

The first and second internal circuits C1 and C2 are connected together by way of a conductor 52 and via a chip-to-chip connection portion (device-to-device connection portion) T1 composed of a chip-to-chip connection pad PM, a bump B, and a pad PD. Moreover, the second internal circuit C2 is connected, via another chip-to-chip connection portion (device-to-device connection portion) T2 composed of another set of a chip-to-chip connection pad PM, a bump B, and a pad PD, to a conductor 51 that is connected through an AND gate G1 to an external connection pad 12 of the mother chip 1. In this configuration, the output signal of the first internal circuit C1 is fed to the second internal circuit C2, and then the output signal of the second internal circuit C2 is fed through the AND gate G1 to the external connection pad 12. The conductor 51 is connected through a pull-up resistor 55 to a supplied voltage Vcc so as to be kept at a high level when the mother chip 1 and the daughter chip 2 are not connected together.

In the mother chip 1, the conductor 52 connecting the first internal circuit C1 to the chip-to-chip connection portion T1 is connected also through an inverter gate G2 and a NAND gate G3, serving as a switching circuit, to the AND gate G1. The NAND gate G3 is connected also, via a chip-to-chip connection pad PM serving as a control input terminal portion T3a, to a control output terminal portion T3b of the daughter chip 2. This control output terminal portion T3b is composed of a bump B and a pad PD that are connected to a ground potential within the daughter chip 2. On the other hand, within the mother chip 1, the control input terminal portion T3a is connected through a pull-up resistor 53 to the supplied voltage Vcc.

In this configuration, when the mother and daughter chips 1 and 2 are bonded together via the chip-to-chip connection portions T1 and T2 and via the control input and output terminal portions T3a and T3b, the NAND gate G3 is kept in a cut-off state, i.e. in a state in which it keeps its output at a high level. As a result, the output signal of the second internal circuit C2 is fed through the AND gate G1 to the external connection pad 12.

On the other hand, when the daughter chip 2 is not bonded to the mother chip 1, the terminal of the NAND gate G3 that is connected to the control input terminal portion T3a is kept at the level of the supplied voltage, and therefore the NAND gate G3 lets the signal fed thereto from the first internal circuit C1 through the inverter gate G2 pass through. Since the conductor 51 is kept at a high level in this case, the AND gate G1 lets the output signal of the NAND gate G3 pass through. In this way, the first internal circuit C1 is connected to the external connection pad 12, and thus the output signal of the first internal circuit C1 is fed to the external connection pad 12.

As described above, even when the daughter chip 2 is not connected to the mother chip 1, the output signal of the first internal circuit C1 of the mother chip 1 can be monitored at the external connection pad 12. Thus, by pressing a test probe onto this external connection pad 12, it is possible to conduct functional testing of the first internal circuit C1 even when the mother chip 1 is alone.

Moreover, since the external connection pad 12 is provided near the edge of the mother chip 1, functional testing using a test probe can easily be conducted by the use of existing equipment for such testing.

Second Embodiment

Figure 3:
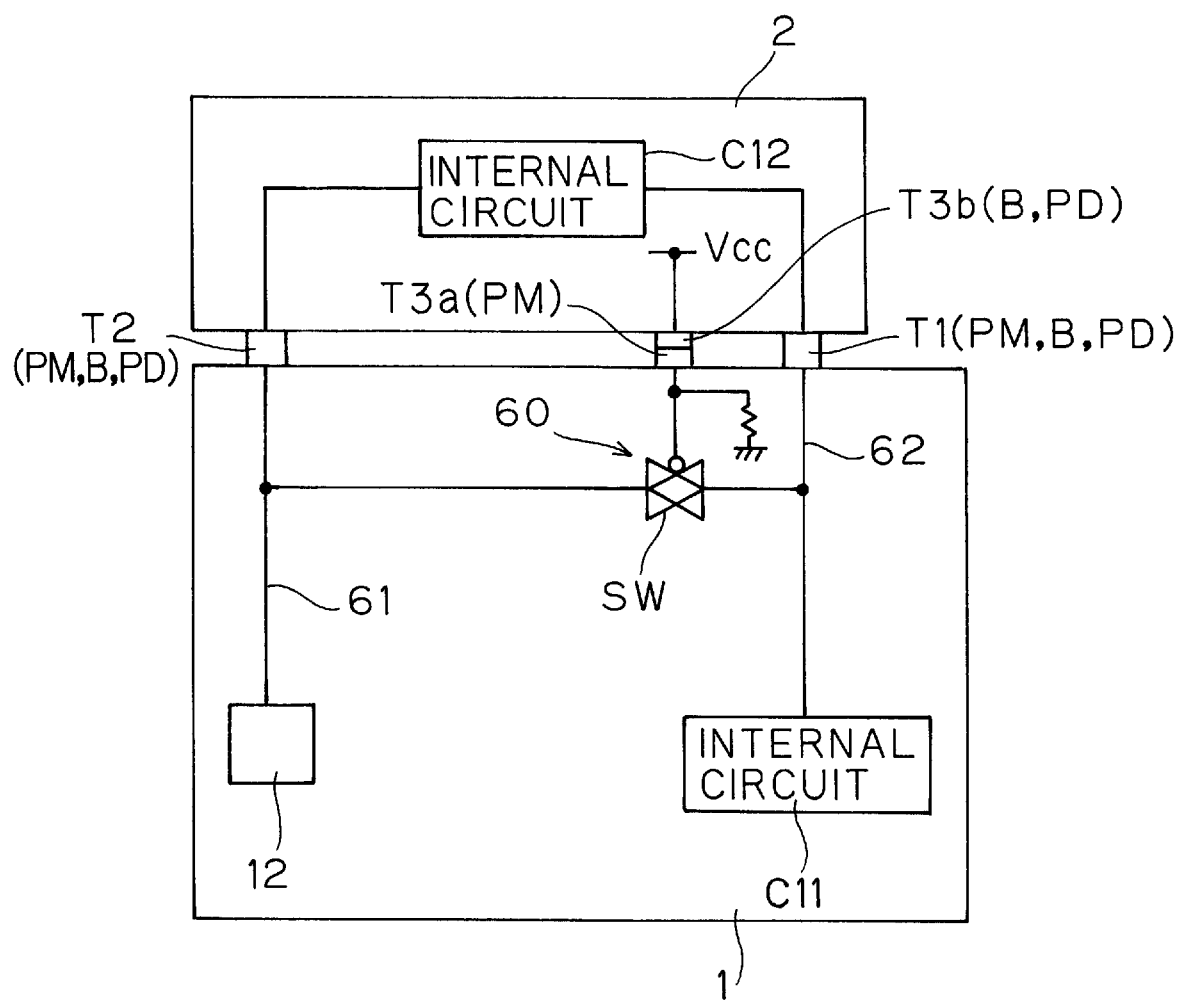
FIG. 3 is a block diagram showing the electrical configuration of the semiconductor device of a second embodiment of the invention.
Figure 4:
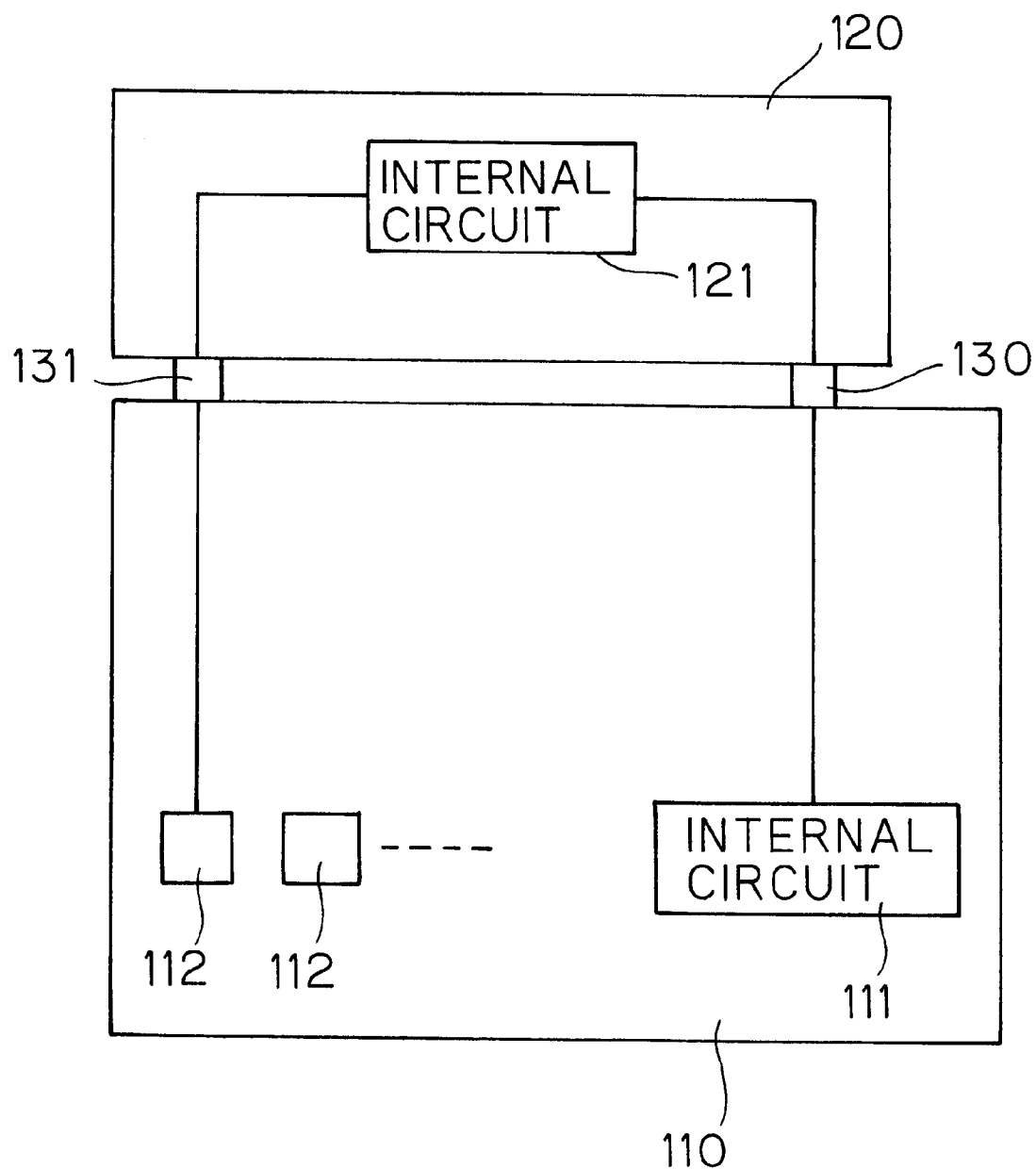
FIG. 4 is a block diagram showing the electrical configuration of a conventional semiconductor device having a chip-on-chip structure.

Next, the semiconductor device of a second embodiment of the invention will be described with reference to FIG. 3. FIG. 3 is a block diagram showing the electrical configuration of the semiconductor device of the second embodiment of the invention. In FIG. 3, those elements that have their counterparts in FIGS. 1 and 2 described previously are identified with the same reference numerals and symbols as in FIGS. 1 and 2. The semiconductor device of this embodiment is built as a semiconductor device for processing an analog signal. Specifically, the internal circuit C11 formed on the semiconductor substrate constituting the base of the mother chip 1 outputs an analog signal, and the internal circuit C12 formed on the semiconductor substrate constituting the base of the daughter chip 2 processes the analog signal fed thereto from the internal circuit C11 of the mother chip 1 and outputs another analog signal to be fed to the mother chip 1.

Accordingly, on the mother chip 1, a switching circuit 60 for switching the analog signal is formed. Specifically, this switching circuit 60 has an analog switch SW connected between the internal circuit C11 and the external connection pad 12. This switch SW receives a switching control signal via the control input terminal portion T3a, and is connected through a resistor to ground (see FIG. 3).

The external connection pad 12 is connected by way of a conductor 61 to the chip-to-chip connection portion T2, to which the output signal of the internal circuit C12 of the daughter chip 2 is fed. The internal circuit C11 of the mother chip 1 is connected by way of a conductor 62 to the chip-to-chip connection portion T1. Whether the conductors 61 and 62 are connected to or disconnected from each other is determined by the analog switch SW.

In this configuration, when the mother and daughter chips 1 and 2 are bonded together, the analog switch SW receives, at its inverting control input terminal, the supplied voltage Vcc from the daughter chip 2 via the control output and input terminal portions T3b and T3a. This brings the analog switch SW into a cut-off state, and therefore the output signal of the internal circuit C11 of the mother chip 1 is wholly fed by way of the conductor 62 and via the chip-to-chip connection portion T1 to the daughter chip 2. Then, the output signal of the internal circuit C12 of the daughter chip 2 is fed via the chip-to-chip connection portion T2 and by way of the conductor 61 to the external connection pad 12.

On the other hand, when the daughter chip 2 is not bonded to the mother chip 1, the analog switch SW is kept in a conducting state, and therefore the output of the internal circuit C11 is connected to the external connection pad 12. As a result, the output signal of the mother chip 1 is fed through the analog switch SW and by way of the conductor 61 to the external connection pad 12. Thus, by pressing a test probe onto this external connection pad 12, it is possible to conduct functional testing of the mother chip 1 even when it is alone.

The present invention can be carried out in any other way than it is carried out in the two embodiments described above. For example, although the above-described embodiments deal with cases in which functional checking is conducted using the external connection pad 12 to which the output signals of the internal circuits C1 and C2, or C11 and C12, are fed, it is possible to use similar configurations in cases where the input signals to the internal circuits C1 and C2, or C11 and C12, are fed to the external connection pad 12, or a plurality of input and output signals are fed in combination to more than one external connection pad 12. This makes it possible to feed a signal for functional checking from a test probe to the internal circuit C2 or C12 of the daughter chip 2 when the mother and daughter chips 1 and 2 are bonded together, and feed a signal for functional checking from a test probe to the internal circuit C1 or C11 of the mother chip 1 when the mother chip 1 alone is subjected to functional checking.

Moreover, although the above-described embodiments deal with cases in which bumps B are formed on the daughter chip 2, it is also possible to form similar bumps on the mother chip 1, or form bumps on both the mother and daughter chips 1 and 2 so that chip-on-chip bonding between the mother and daughter chips 1 and 2 will be achieved by bonding the bumps together. Moreover, instead of relatively high metal protrusions such as bumps, it is possible to use vapor-deposited metal films or the like.

Furthermore, although the above-described embodiments deal with cases in which only one daughter chip 2 is bonded to the surface 11 of the mother chip 1, it is possible to bond two or more daughter chips on the surface 11 of the mother chip 1.

Furthermore, although the above-described embodiments deal with cases in which both the mother chip 1 and the daughter chip 2 are made of silicon, it is possible to use semiconductor chips made of any other material than silicon, such as gallium-arsenide or germanium, in semiconductor devices embodying the present invention. The first and second semiconductor chips may be made of either identical or different materials.

Moreover, although the above-described embodiments deal with semiconductor devices having chip-on-chip structures, the present invention is applicable also to semiconductor devices built by connecting a plurality of semiconductor chips together by any other method such as wire bonding.

Obviously, many modifications and variations of the present invention are possible in light of the above teachings. It is therefore to be understood that within the scope of the appended claims, the invention may be practiced other than as specifically described.

What is claimed is:

1. A semiconductor device comprising:

a semiconductor substrate;

a circuit formed on said semiconductor substrate so as to achieve a desired function by being connected to and thereby functionally complemented or enhanced by another semiconductor device having a predetermined function;

a device-to-device connection portion formed on said semiconductor substrate so as to connect said circuit to said other semiconductor device having the predetermined function;

an external connection portion formed on said semiconductor substrate to connect with said device-to-device connection so as to allow input/output of a signal from/to an external device; and a switcher formed on said semiconductor substrate so as to switch between a state in which said circuit is disconnected from said external connection portion and a state in which said circuit is connected to said external connection portion, wherein said switcher disconnects said circuit from said external connection portion when said other semiconductor device is connected to said device-to-device connection portion, and connects said circuit to said external connection portion so that a signal from said circuit is fed out through said external connection portion when said other semiconductor device is not connected to said device-to-device connection portion.

2. A semiconductor device as claimed in claim 1, further comprising:

a control input terminal portion for receiving a switching control signal that is to be fed to said switcher, wherein said control input terminal portion is so formed as to be connected to a control output terminal portion provided on said other semiconductor device.

3. A semiconductor device comprising:

a first semiconductor chip having a first circuit;

a second semiconductor chip having a second circuit that is connected to the first circuit so as to functionally complement or enhance a function of the first circuit;

a device-to-device connection portion for connecting the first and second circuits to each other;

an external connection portion formed on the first semiconductor chip to connect with said device-to-device connection portion so as to allow input/output of a signal from/to an external device; and a switching circuit formed on the first semiconductor chip so as to switch between a state in which the first circuit is disconnected from the external connection portion and the second circuit is connected to the external connection portion and a state in which the first circuit is connected to the external connection portion, wherein said switching circuit disconnects said first circuit from said external connection portion and connects said second circuit to said external connection portion so that an output signal from said second circuit is fed out via said external connection portion when said first and second semiconductor chips are connected together, and connects said first circuit to said external connection portion so that a signal from said first circuit is fed out through said external connection portion when said first and second semiconductor chips are not connected together.

4. A semiconductor device as claimed in claim 3, wherein the first and second semiconductor chips are superposed on and bonded to each other so as to form a semiconductor device having a chip-on-chip structure as a whole, and the device-to-device connection portion is placed between a surface of the first semiconductor chip and a surface of the second semiconductor chip so as to bond the first and second semiconductor chips together.

5. A semiconductor device as claimed in claim 3, wherein the first semiconductor chip further comprises a control input terminal portion for receiving a switching control signal that is to be fed to the switching circuit, and the second semiconductor chip further comprises a control output terminal portion that is connected to the control input terminal portion of the first semiconductor chip.

* * * * *